(12) United States Patent
Okazaki

(10) Patent No.: US 6,647,029 B1
(45) Date of Patent: *Nov. 11, 2003

(54) VARIABLE-WAVELENGTH SEMICONDUCTOR LASER DEVICE CONTROLLED BY STRENGTH OF ELECTRIC FIELD APPLIED TO WAVELENGTH SELECTION ELEMENT

(75) Inventor: Yoji Okazaki, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/521,197

(22) Filed: Mar. 7, 2000

(30) Foreign Application Priority Data

Mar. 9, 1999 (JP) ............................................. 11-061648

(51) Int. Cl.$^7$ .............................. H01S 3/10; H01S 3/13; H01S 3/08
(52) U.S. Cl. ........................... 372/20; 372/32; 372/102; 372/105
(58) Field of Search ...................... 372/20, 102, 105, 372/43, 32, 12

(56) References Cited

U.S. PATENT DOCUMENTS

| | | | | |
|---|---|---|---|---|
| 4,233,569 A | * | 11/1980 | Liu ................................ | 372/23 |
| 5,392,308 A | * | 2/1995 | Welch et al. .................. | 372/92 |
| 5,497,387 A | * | 3/1996 | Okazaki ........................ | 372/21 |
| 5,608,743 A | * | 3/1997 | Hayakawa ..................... | 372/20 |
| 5,699,372 A | * | 12/1997 | Okazaki ........................ | 372/21 |
| 5,949,804 A | | 9/1999 | Okazaki ........................ | 372/32 |
| 6,041,071 A | * | 3/2000 | Tayebati ........................ | 372/64 |

OTHER PUBLICATIONS

D. Mehuys; D. Welch and D. Scifres, "1W CW, Diffraction–Limited, Tunable External–Cavity Semiconductor Laser", Electronics Letters, vol. 29, No. 14, pp. 1254–125, Jul. 1993.

A.K. Goyal, P. Gavrilovic and H. Po, "1.35 of Stable Single–Frequency Emission from an External–Cavity Tapered Oscillator Utilizing Fiber Brag Grating Feedback", Applied Physics Letters, vol. 73, No. 5, pp. 575–577, Aug. 1998.

\* cited by examiner

*Primary Examiner*—Paul Ip
*Assistant Examiner*—James Menefee
(74) *Attorney, Agent, or Firm*—Stroock & Stroock & Lavan LLP

(57) ABSTRACT

A variable-wavelength semiconductor laser device containing a tapered-stripe semiconductor laser amplifier and a wavelength selection unit. Light emitted from a back end surface of the tapered-stripe semiconductor laser amplifier is incident on the wavelength selection unit. The wavelength selection unit selects a portion of the light having a specific wavelength, and returns the selected portion to the tapered-stripe semiconductor laser amplifier. The tapered-stripe semiconductor laser amplifier amplifies the returned portion of the light to emit the amplified light from a front-end surface of the tapered-stripe semiconductor laser amplifier. The wavelength selection unit is constructed so that the specific wavelength can be changed according to strength of an electric field applied to the wavelength selection unit. An electric field applying unit is provided for applying the electric field to the wavelength selection unit. The wavelength selection unit may contain a fiber grating, a birefringent filter, or an optical waveguide element having therein a reflection grating. In this case, the specific wavelength selected by the wavelength selection unit can be changed by changing a refraction index and/or an effective pitch of the grating, which can be changed by adjusting the strength of the electric field.

2 Claims, 3 Drawing Sheets

F I G. 4
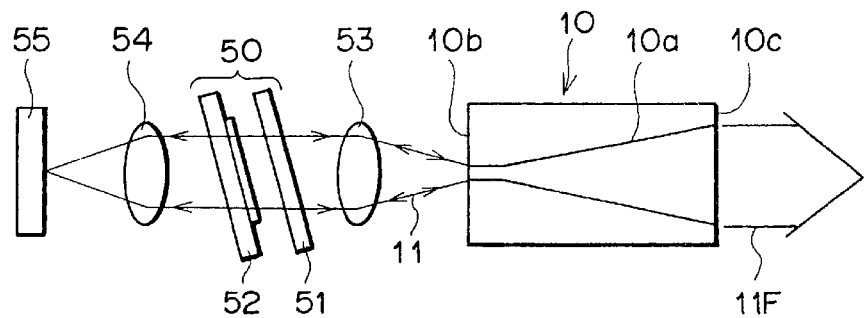
F I G. 5
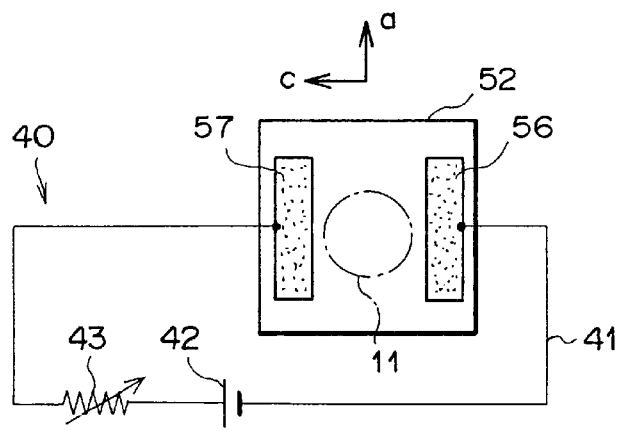
F I G. 6
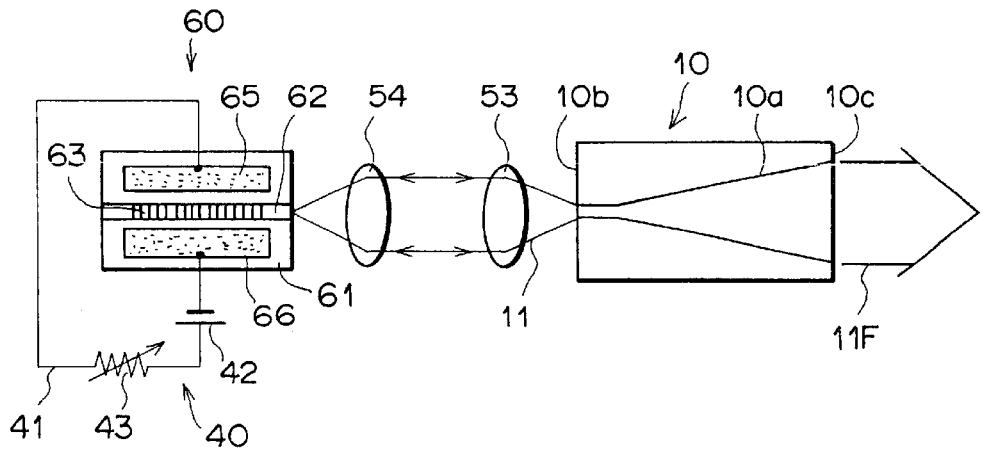

VARIABLE-WAVELENGTH SEMICONDUCTOR LASER DEVICE CONTROLLED BY STRENGTH OF ELECTRIC FIELD APPLIED TO WAVELENGTH SELECTION ELEMENT

BACKGROUND OF THE INVENTION

1. Field of the Invention

The present invention relates to a semiconductor laser device which emits laser light having an arbitrarily variable wavelength. In particular, the present invention relates to a variable-wavelength semiconductor laser device which contains a tapered-stripe semiconductor laser amplifier as a light source, where wavelength selection is performed on laser light emitted from the tapered-stripe semiconductor laser amplifier, and then the laser light having the selected wavelength is returned to the tapered-stripe semiconductor laser amplifier to be amplified therein.

2. Description of the Related Art

Various attempts have been made to obtain a high-power laser beam having a single wavelength by utilizing a semiconductor device. As one of such attempts, a semiconductor laser device is disclosed in Electronics Letters, vol. 29, No. 14 (1993), 1254-1255.

As illustrated in FIG. 7, the above semiconductor laser device contains a tapered-stripe semiconductor laser amplifier 1 as a light source, and laser light emitted from the back end surface 1a of the semiconductor laser device 1 is collimated by the lens 2 to be incident on the reflection grating 3. Only the laser light 4 having a single wavelength is reflected by the reflection grating 3 to be returned to the tapered-stripe semiconductor laser amplifier 1. Therefore, the wavelength of the laser light 4F emitted from the front-end surface 1b is locked to the single wavelength. Thus, the variable-wavelength semiconductor laser device of FIG. 7 can output a laser beam of a high output power (not less than 1 W) and high quality (close to a diffraction limit).

In the above semiconductor laser device, the selected wavelength can be changed by rotating the reflection grating 3 in the directions as indicated by the arrows A in FIG. 7. Thus, the oscillation frequency can be changed.

In the semiconductor laser device in which the oscillation wavelength is selected by a reflection grating, the oscillation wavelength can be changed over a considerably wide range. However, there are drawbacks. That is, since the reflection grating is rotated by a mechanical driving means, downsizing of the device and precise tuning are difficult. In addition, the output is liable to become unstable, for example, due to misalignment of the constituents of the semiconductor laser device.

Japanese Unexamined Patent Publication No. 10(1998)-190105 proposes a semiconductor laser device in which a birefringent filter is provided as a wavelength selection means, instead of the above-mentioned reflection grating.

This provision is made in order to lower a threshold current for oscillation and increasing luminous efficiency. In addition, Applied Physics Letters, vol. 73, No. 5 (1998), 575–577 discloses a semiconductor laser device using a fiber grating as a wavelength selection means, instead of the above-mentioned reflection grating. In these semiconductor laser devices respectively using the birefringent filter and the fiber grating, the oscillation wavelength can be slightly changed by changing a driving current.

Since the semiconductor laser devices using a birefringent filter or fiber grating do not contain a mechanical driving means, the aforementioned drawbacks of the semiconductor laser device using the reflection grating do not exist in the semiconductor laser devices respectively using the birefringent filter and the fiber grating. However, the variable range of the oscillation wavelength by changing the driving current is very small, i.e., practically, the oscillation wavelength is not variable in the above semiconductor laser devices using the birefringent filter or the fiber grating.

SUMMARY OF THE INVENTION

The object of the present invention is to provide a variable-wavelength semiconductor laser device which contains a tapered-stripe semiconductor laser amplifier as a light source, emits laser light having a variable wavelength, and realizes downsizing, precise tuning of oscillation wavelength, and a stable output.

The above object is accomplished by the present invention, which provides a variable-wavelength semiconductor laser device containing a tapered-stripe semiconductor laser amplifier which emits first light from a first end surface thereof, receives second light from the first surface, and emits third light from a second surface thereof; a wavelength selection unit which receives the first light, selects a wavelength from among a plurality of wavelengths included in the first light according to strength of an electric field applied to the wavelength selection unit, and returns to the tapered-stripe semiconductor laser amplifier a portion of the first light having the selected wavelength as the second light; and an electric field applying unit which applies the electric field to the wavelength selection unit.

According to the present invention, the selected wavelength can be changed by varying the strength of the electric field applied to the wavelength selection unit, and therefore the selected wavelength can be precisely tuned by appropriately adjusting the strength of the electric field applied to the wavelength selection unit. In addition, since the variable-wavelength semiconductor laser device according to the present invention contains no mechanical driving means for changing the selected wavelength, the size of the device can be reduced compared with the conventional device which uses the mechanical driving means, and a stable output can be obtained.

(i) In the above variable-wavelength semiconductor laser device according to present invention, the wavelength selection unit may include a fiber grating which contains a core and a plurality of refractive index variation portions formed in the core at regular intervals, and reflects and diffracts the first light to determine the selected wavelength and return the second light to the tapered-stripe semiconductor laser amplifier. In this case, the electric field applying unit may include a pair of electrodes which are formed so that the plurality of refractive index variation portions are located between the pair of electrodes. In addition, the electric field applying unit may include a unit for applying the electric field between the pair of electrodes.

In the variable-wavelength semiconductor laser device described in the above paragraph (i), when an electric field is applied to the above plurality of refractive index variation portions in the fiber grating, the plurality of refractive index variation portions generate heat to change the volume of the plurality of refractive index variation portions. At this time, refractive indexes of the plurality of refractive index variation portions also change due to a thermooptic (TO) effect, and thus an effective grating constant (i.e., an effective pitch of the fiber grating) changes. Therefore, the effective grating constant, the selected wavelength, and the oscillation wavelength can be arbitrarily changed by changing the strength of the electric field applied to the plurality of refractive index variation portions in the fiber grating.

(ii) In the above variable-wavelength semiconductor laser device according to present invention, the wavelength selection unit may include a birefringent filter containing at least one birefringent element made of a material exhibiting an electrooptic (EO) effect, and a mirror which reflects the first light after the first light has passed through the birefringent filter. In this case, the electric field applying unit may include a pair of electrodes which are formed so that portions of the birefringent filter through which the first light passes are located between the pair of electrodes, and a unit for applying the electric field between the pair of electrodes.

In the variable-wavelength semiconductor laser device described in the above paragraph (ii), when an electric field is applied to the at least one birefringent element made of the material exhibiting the electrooptic (EO) effect, the refractive index of the at least one birefringent element changes due to the electrooptic (EO) effect. Therefore, the refractive index of the at least one birefringent element, the selected wavelength, and the oscillation wavelength can be arbitrarily changed by varying the strength of the electric field applied to the at least one birefringent element.

(iii) In the variable-wavelength semiconductor laser device described in the above paragraph (ii), the material of which the at least one birefringent element is made may be $LiNb_xTa_{1-x}O_3$ ($0 \leq x \leq 1$), or doped with at least one of MgO and ZnO. When the birefringent element has a c axis, the pair of electrodes may be separated from each other in the direction of the c axis of the birefringent element.

(iv) In the above variable-wavelength semiconductor laser device according to present invention, the wavelength selection unit may include an optical waveguide element which contains a substrate showing an electrooptic effect, an optical waveguide being formed in the substrate and having therein a reflection grating which reflects and diffracts the first light to determine the selected wavelength and return the second light to the tapered-stripe semiconductor laser amplifier. In this case, the electric field applying unit may include a pair of electrodes which are formed so that the reflection grating is located between the pair of electrodes, and a unit for applying the electric field between the pair of electrodes.

In the variable-wavelength semiconductor laser device described in the above paragraph (iv), when an electric field is applied to the above reflection grating formed in the optical waveguide, an effective grating constant (i.e., an effective pitch of the reflection grating) changes due to the electrooptic (EO) effect. Therefore, the effective grating constant, the selected wavelength, and the oscillation wavelength can be arbitrarily changed by changing the strength of the electric field applied to the reflection grating in the optical waveguide.

(v) In the variable-wavelength semiconductor laser device described in the above paragraph (iv), the substrate may be $LiNb_xTa_{1-x}O_3$ ($0 \leq x \leq 1$), or doped with at least one of MgO and ZnO.

DESCRIPTION OF THE DRAWINGS

FIG. 4 is a plan view of the variable-wavelength semiconductor laser device as the second embodiment of the present invention.

FIG. 5 is a diagram illustrating an arrangement of a pair of electrodes in the birefringent element in the variable-wavelength semiconductor laser device as the second embodiment of the present invention.

FIG. 6 is a plan view of the variable-wavelength semiconductor laser device as the third embodiment of the present invention.

DESCRIPTION OF PREFERRED EMBODIMENTS

Embodiments of the present invention are explained in detail below with reference to drawings.

First Embodiment

Figure 1:
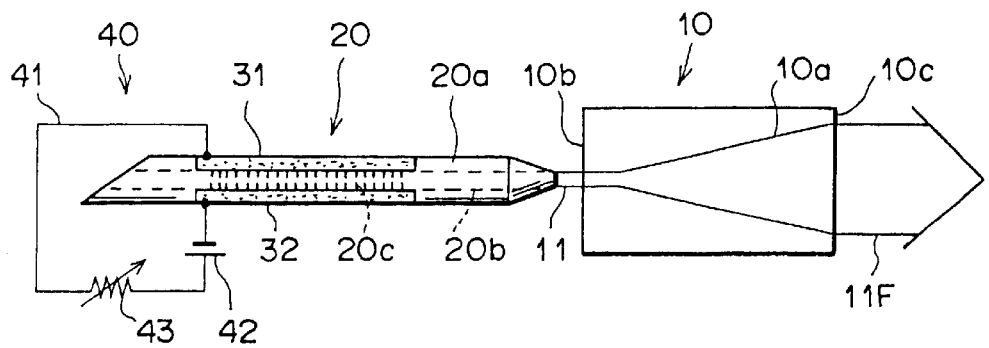
FIG. 1 is a plan view of the variable-wavelength semiconductor laser device as the first embodiment of the present invention.

FIG. 1 is a plan view of the variable-wavelength semiconductor laser device as the first embodiment of the present invention. The variable-wavelength semiconductor laser device in FIG. 1 contains a tapered-stripe semiconductor laser amplifier 10 having a tapered stripe structure 10a, a reflection-type fiber grating 20 which is arranged so that a light beam emitted from the back end surface 10b of the tapered-stripe semiconductor laser amplifier 10 is incident on the core 20b of the reflection-type fiber grating 20, a pair of electrodes 31 and 32 formed on the external surface of the reflection-type fiber grating 20, and an electric field applying circuit 40 which applies an electric field between the pair of electrodes 31 and 32.

Figure 2:
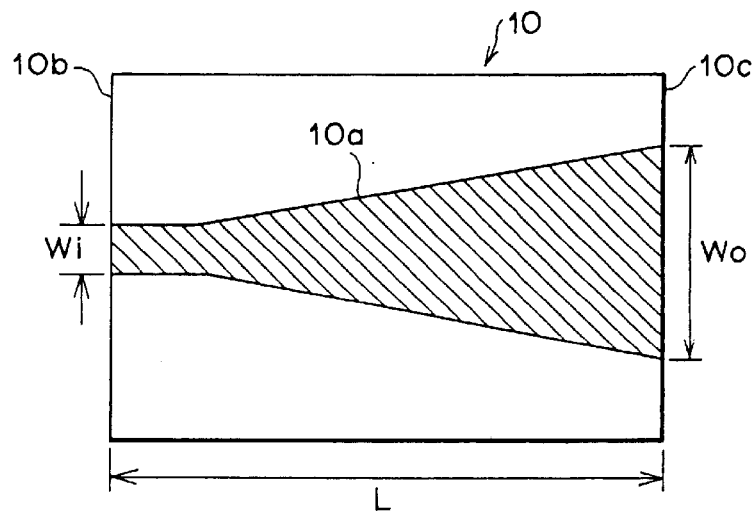
FIG. 2 is an enlarged view of the tapered-stripe semiconductor laser amplifier in the variable-wavelength semiconductor laser device as the first embodiment of the present invention.

FIG. 2 is an enlarged view of the tapered-stripe semiconductor laser amplifier in the variable-wavelength semiconductor laser device in FIG. 1. As illustrated in FIG. 2, the tapered-stripe semiconductor laser amplifier 10 contains the tapered stripe structure 10a. In an example, the width Wi of the tapered stripe structure 10a at the back end surface 10b is 4 μm, the width Wo of the tapered stripe structure 10a at the front end surface 10c is 360 μm, and the length L is 1.5 mm. For example, the tapered-stripe semiconductor laser amplifier 10 contains an n-type GaAs substrate (doped with Si of $2\times10^{18}$ cm$^{-3}$), an n-type GaAs buffer layer (doped with Si of $1\times10^{18}$ cm$^{-3}$ and 0.5 μm thick), an n-type $Al_{0.5}Ga_{0.5}As$ cladding layer (doped with Si of $1\times10^{18}$ cm$^{-3}$ and 2.5 μm thick), an n-type $Al_{0.25}Ga_{0.75}As$ optical waveguide layer (undoped and 0.05 μm thick), an n-type $Al_{0.05}Ga_{0.95}As$ quantum well layer (undoped and 8 nm thick), an n-type $Al_{0.25}Ga_{0.75}As$ optical waveguide layer (undoped and 0.05 μm thick), a p-type $Al_{0.5}Ga_{0.5}As$ cladding layer (doped with Zn of $1\times10^{18}$ cm$^{-3}$ and 2 μm thick), a p-type GaAs cap layer (doped with Zn of $5\times10^{18}$ cm$^{-3}$ and 0.3 μm thick), formed in this order by the low pressure MOCVD technique.

For example, the tapered stripe structure 10a may be formed as follows. First, an $SiO_2$ film is formed on the above cap layer by the plasma CVD technique. Next, a portion, corresponding to the tapered stripe structure 10a, of the $SiO_2$ film is removed by photolithography and etching. Then, an AuZn/Au p-electrode and an AuGe/Ni/Au n-electrode are formed as ohmic electrodes.

In addition, low reflectance coating is laid on both the end surfaces 10b and 10c of the tapered-stripe semiconductor laser amplifier 10 so that the reflectance viewed from inside of the tapered-stripe semiconductor laser amplifier 10 is not more than 0.5%. Thus, the tapered-stripe semiconductor laser amplifier 10 is formed as a traveling wave amplifier.

Figure 3:
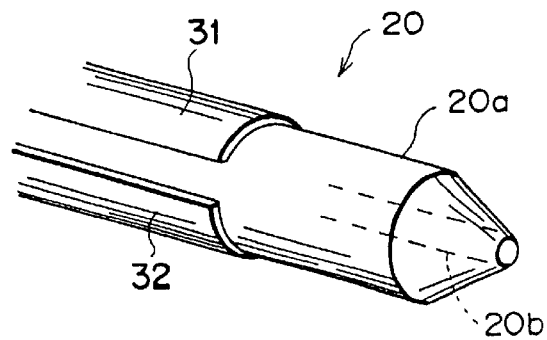
FIG. 3 is an enlarged perspective view of the fiber grating in the variable-wavelength semiconductor laser device as the first embodiment of the present invention.
Figure 7:
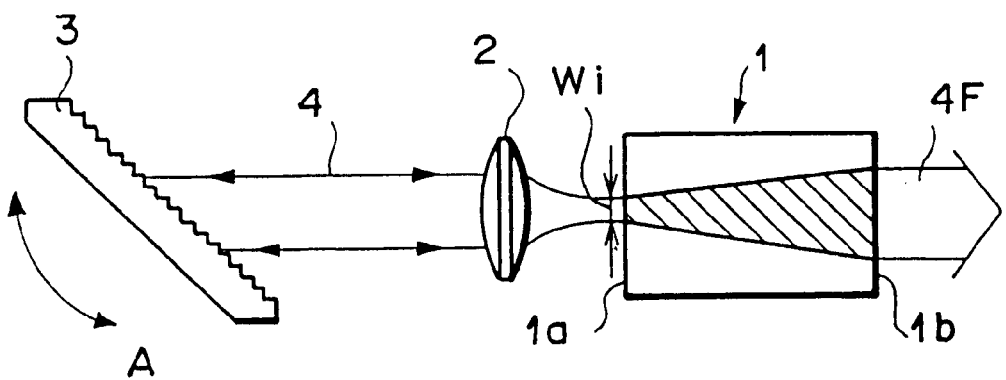
FIG. 7 is a plan view of an example of the conventional variable-wavelength semiconductor laser devices.

FIG. 3 is an enlarged perspective view of the fiber grating in the variable-wavelength semiconductor laser device in FIG. 1. As illustrated in FIG. 3, the reflection-type fiber grating 20 is an optical fiber comprising the above-mentioned core 20b and a cladding 20a which surrounds the core 20b and has a greater refractive index than the core 20b. In the core 20b, a plurality of refractive index variation portions 20c are formed at regular intervals. In an example, the outside diameter of the cladding 20a is 125 µm, and the diameter of the core 20b is about 10 µm. For example, in a core of an optical fiber for use in communication having the above dimension, the plurality of refractive index variation portions 20c are formed by generating two-beam interference fringes of excimer laser light (in the ultraviolet region) to change (increase) refractive indexes of portions which are exposed to the two-beam interference light. When the core 20b is doped with germanium dioxide, it is considered that the above change of the refractive index is caused by chemical change of germanium dioxide due to the exposure to the ultraviolet light.

The electrodes 31 and 32 are formed on the external surface of the cladding 20a so that the plurality of refractive index variation portions 20c are located between the electrodes 31 and 32. The electric field applying circuit 40 includes a closed circuit 41 containing a direct current power supply 42 and a variable resistor 43 connected in series. The electrodes 31 and 32 are connected to both ends of the closed circuit 41, respectively.

The operations of the variable-wavelength semiconductor laser device as the first embodiment of the present invention are explained in detail below.

Light beam 11 emitted from the back end surface 10b of the tapered-stripe semiconductor laser amplifier 10 is incident on an end surface of the reflection-type fiber grating 20 to enter the core 20b and propagate therethrough. The plurality of refractive index variation portions 20c formed in the core 20b realize a grating along the direction of the propagation of the light beam 11. This grating reflects only a portion of the light beam 11 which has a specific wavelength corresponding to the pitch of the grating (grating constant) to feedback the reflected portion to the tapered-stripe semiconductor laser amplifier 10.

Although the light beam 11 originally emitted from the back end surface 10a of the tapered-stripe semiconductor laser amplifier 10 includes a wavelength range of 800 to 820 nm, the portion of the light beam 11 reflected by the reflection-type fiber grating 20 is light having a single wavelength and a half width of about 0.1 nm, due to the function of the wavelength selection in the reflection-type fiber grating 20, where the single wavelength is in the above wavelength range of the original light beam 11. Thus, the oscillation wavelength of the tapered-stripe semiconductor laser amplifier 10 is simplified to the single wavelength. This single-wavelength light is amplified while the light beam travels in the forward direction through the tapered-stripe semiconductor laser amplifier 10, and the amplified light 11F is emitted from the front-end surface 10c of the tapered-stripe semiconductor laser amplifier 10.

Next, explanations are provided on the change of the oscillation wavelength.

When a voltage is applied from the direct current power supply 42 to the electrodes 31 and 32, an electric field is applied to the plurality of refractive index variation portions 20c in the reflection-type fiber grating 20, where the plurality of refractive index variation portions 20c are located between the electrodes 31 and 32. The strength of the electric field can be continuously changed by manipulating the variable resistor 43.

When the electric field is applied to the plurality of refractive index variation portions 20c, the plurality of refractive index variation portions 20c generate heat. The volume of the plurality of refractive index variation portions 20c is changed due to the heat, and the refractive indexes of the plurality of refractive index variation portions 20c are also changed due to the thermooptic effect. Thus, the effective pitch of grating is changed. Therefore, when the strength of the electric field is changed by manipulating the variable resistor 43, the effective pitch of the grating is changed, and thus the wavelength selected by the reflection-type fiber grating 20, i.e., the oscillation wavelength, is changed. That is, the oscillation wavelength can be changed arbitrarily by manipulating the variable resistor 43.

As described above, the oscillation wavelength in the variable-wavelength semiconductor laser device as the first embodiment can be changed without the provision of the mechanical driving means. Therefore, the size of the variable-wavelength semiconductor laser device as the first embodiment can be reduced to a smaller size than that of the variable-wavelength semiconductor laser device which uses the mechanical driving means for changing the oscillation wavelength. In addition, the oscillation wavelength of the variable-wavelength semiconductor laser device as the first embodiment can be precisely tuned, and a stable output can be obtained.

Second Embodiment

FIG. 4 shows the construction of the variable-wavelength semiconductor laser device as the second embodiment of the present invention, and FIG. 5 shows an arrangement of a pair of electrodes in the birefringent element in the variable-wavelength semiconductor laser device in FIG. 4. In FIGS. 1, 4, and 5, elements bearing the same reference numbers function in the same manner.

In the construction of FIG. 4, a light beam 11 emitted from the back end surface 10a of the tapered-stripe semiconductor laser amplifier 10 is collimated by the collimator lens 53, and passes through the birefringent filter 50. Then, the light beam 11 is collected by the condenser lens 54, and focused on the mirror 55. The light beam 11 is reflected by the mirror 55, and retraces the above path to be returned to the tapered-stripe semiconductor laser amplifier 10. The wavelength of the returned light beam is simplified to a single wavelength by the birefringent filter 50, and thus the oscillation wavelength of the tapered-stripe semiconductor laser amplifier 10 is also simplified to this wavelength. The light beam having this wavelength is amplified while the light beam travels through the tapered-stripe semiconductor laser amplifier 10 in the forward direction. Then, the amplified light 11F is emitted from the front-end surface 10c of the tapered-stripe semiconductor laser amplifier 10.

Next, explanations are provided on the operation of selecting a wavelength by the birefringent filter 50.

The birefringent filter 50 in FIG. 4 contains two birefringent elements 51 and 52, each realizing a half-wave plate for a single wavelength. In this example, the single wavelength is 810 nm. The birefringent elements 51 and 52 are arranged so that the light beam 11 from the tapered-stripe semiconductor laser amplifier 10 is incident on the birefringent element 51 at the Brewster's angle (polarizing angle). Therefore, transmittance of a p-polarization component of the light beam 11 having the single wavelength at the boundary between the air and the birefringent element 51 is 100%, while transmittances of other polarization components of the light beam 11 at the boundary between the air and the birefringent element 51 is less than 100%, e.g., transmittance of an s-polarization component of the light beam 11 at the boundary between the air and the birefringent element 51 is 30%. Transmittances of the respective polarization components are the same as above at the other boundaries: the other boundary between the air and the birefringent element 51 and two boundaries between the air and the birefringent element 52.

Thus, during a round trip between the back end surface 10b and the mirror 55, the light beam 11 is incident on the above boundaries eight times at the Brewster's angle. Since the p-polarization component of the light beam having the wavelength of 810 nm maintains the p-polarization state after the p-polarization component is incident on (and passes through) any of the above boundaries, transmittance of the p-polarization component of the light beam 11 through the round trip between the tapered-stripe semiconductor laser amplifier 10 and the mirror 55 is close to 100%, e.g., about 99%. However, when p-polarization components of the light beam 11 having other wavelengths are incident on any of the above boundaries, the orientation of the linear polarization is changed, i.e., the p-polarization states of the components of the light beam 11 having the wavelengths other than the above single wavelength (810 nm) are not maintained. Therefore, when a linearly polarized light beam is incident on the birefringent filter 50 in the p-polarized mode, only the p-polarization component of the above single wavelength is returned to the tapered-stripe semiconductor laser amplifier 10 after the round trip between the tapered-stripe semiconductor laser amplifier 10 and the mirror 55. That is, the single wavelength is selected by the birefringent filter 50, which functions as a Lyot filter.

Next, explanations are provided on the change of the oscillation wavelength.

The birefringent elements 51 and 52 are made of LiNbO$_3$ which is doped with MgO. This material exhibits an electrooptic (EO) effect in addition to birefringence. A pair of electrodes 56 and 57 are formed on the birefringent element 52, as illustrated in FIG. 5. The electrodes 56 and 57 are separated in the direction of the c-axis of the birefringent element 52 so that the portion of the birefringent element 52 through which the light beam 11 passes is located between the electrodes 56 and 57. The electric field applying circuit 40, which is similar to the electric field applying circuit 40 in FIG. 1, is connected to the electrodes 56 and 57.

When a voltage is applied from the direct current power supply 42 to the electrodes 56 and 57, an electric field is applied to the portion of the birefringent element 52 through which the light beam 11 passes. The strength of the electric field can be continuously changed by manipulating the variable resistor 43.

When the electric field is applied to the portion of the birefringent element 52 through which the light beam 11 passes, the refractive index of the portion of the birefringent element 52 through which the light beam 11 passes is changed due to the electrooptic effect. Therefore, when the strength of the electric field is changed by manipulating the variable resistor 43, the refractive index of the portion of the birefringent element 52 through which the light beam 11 passes is changed, and thus the wavelength selected by the birefringent filter 50, i.e., the oscillation wavelength, is changed. That is, the oscillation wavelength can be changed arbitrarily by manipulating the variable resistor 43.

As described above, the oscillation wavelength of the variable-wavelength semiconductor laser device as the second embodiment can be changed without the provision of the mechanical driving means. Therefore, the size of the variable-wavelength semiconductor laser device as the second embodiment can be reduced to a smaller size than that of the conventional variable-wavelength semiconductor laser device which uses the mechanical driving means for changing the oscillation wavelength. In addition, the oscillation wavelength of the variable-wavelength semiconductor laser device as the second embodiment can be precisely tuned, and a stable output can be obtained.

Third Embodiment

FIG. 6 is a plan view of the variable-wavelength semiconductor laser device as the third embodiment of the present invention. In the third embodiment, an optical waveguide element 60 is provided as a wavelength selection element. As illustrated in FIG. 6, the optical waveguide element 60 is constructed by forming an optical waveguide 62 in the substrate 61, and a reflection grating 63 in the optical waveguide 62. The substrate 60 is made of a material exhibiting the electrooptic effect. In this example, LiNbO$_3$ doped with MgO is used.

In the variable-wavelength semiconductor laser device in FIG. 6, the light beam 11 emitted from the back end surface 10a of the tapered-stripe semiconductor laser amplifier 10 is collimated by the collimator lens 53, and collected by the condenser lens 54 to be focused on an end surface of the optical waveguide 62. The light beam 11 enters the optical waveguide 62, and propagates through the optical waveguide 62 in a guided mode. At this time, only a portion of the light beam 11 having a specific wavelength is reflected and diffracted by the reflection grating 63. The portion of the light beam 11 reflected and diffracted by the reflection grating 63 retraces the above path to be returned to the tapered-stripe semiconductor laser amplifier 10.

The wavelength of the returned light beam is simplified to a single wavelength by the reflection grating 63, and thus the oscillation wavelength of the tapered-stripe semiconductor laser amplifier 10 is also simplified to this wavelength. A light beam 11F having this wavelength is amplified while the light beam travels through the tapered-stripe semiconductor laser amplifier 10 in the forward direction. The amplified light beam 11F is emitted from the front-end surface 10c of the tapered-stripe semiconductor laser amplifier 10.

Next, explanations are provided on the change of the oscillation wavelength.

A pair of electrodes 65 and 66 are formed on the substrate 61 of the optical waveguide element 60 so that the reflection grating 63 in the optical waveguide 62 is located between the electrodes 56 and 57, as illustrated in FIG. 6. The electric field applying circuit 40, which is similar to the electric field applying circuit 40 in FIG. 1, is connected to the electrodes 65 and 66.

When a voltage is applied from the direct current power supply 42 to the electrodes 65 and 66, an electric field is applied to the reflection grating 63 in the optical waveguide 62. The strength of the electric field can be continuously changed by manipulating the variable resistor 43.

When the electric field is applied to the reflection grating 63 in the optical waveguide 62, the refractive index of the reflection grating 63 in the optical waveguide 62 is changed due to the electrooptic effect. Therefore, when the strength of the electric field is changed by manipulating the variable resistor 43, the refractive index of the reflection grating 63 in the optical waveguide 62 is changed, and thus the effective pitch of the reflection grating 63 is changed. Therefore, when the strength of the electric field is changed by manipulating the variable resistor 43, the effective pitch of the reflection grating 63 is changed, and thus the wavelength selected by the reflection grating 63, i.e., the oscillation wavelength, is changed. That is, the oscillation wavelength can be changed arbitrarily by manipulating the variable resistor 43.

As described above, the oscillation wavelength of the variable-wavelength semiconductor laser device as the third embodiment can be changed without the provision of the mechanical driving means. Therefore, the size of the variable-wavelength semiconductor laser device as the third embodiment can be reduced to a smaller size than that of the variable-wavelength semiconductor laser device which uses the mechanical driving means for changing the oscillation wavelength. In addition, the oscillation wavelength of the variable-wavelength semiconductor laser device as the third embodiment can be precisely tuned, and a stable output can be obtained.

In addition, all of the contents of the Japanese Patent Application No. 11(1999)-61648 are incorporated into this specification by reference.

What is claimed is:

1. A variable-wavelength semiconductor laser device comprising:

a tapered-stripe semiconductor laser amplifier which is constructed to emit a first light from a first end surface, receive a second light from the first surface thereof, and emit a third light from a second surface thereof, wherein said third light maintains a transmittance of a p-polarization component close to 100% resulting in a high output laser light;

a wavelength selection unit which is constructed to receive the first light, selects a wavelength from among a plurality of wavelengths included in the first light according to strength of an electric field applied to the wavelength selection unit, and returns to the tapered-stripe semiconductor laser amplifier a portion of the first light having the selected wavelength as the second light, wherein said wavelength selection unit includes a birefringent filter containing at least one birefringent element made of a material exhibiting an electrooptic effect, and a mirror which reflects the first light after the first light has passed through the birefringent filter; and an electric field applying unit which applies said electric field to said wavelength selection unit, wherein said electric field applying unit includes a pair of electrodes which are formed so that portions of said birefringent filter through which said first light passes are located between the pair of electrodes, and a unit for applying the electric field between the pair of electrodes.

2. A variable-wavelength semiconductor laser device according to claim 1, wherein said material of which said at least one birefringent element is made is $LiNb_xTa_{1-x}O_3$ ($0 \leq x \leq 1$), or doped with at least one of MgO and ZnO, said birefringent element has a c axis, and said pair of electrodes are separated from each other in a direction of the c axis of the birefringent element.

* * * * *